May 10, 1960 R. J. SMITH 2,936,427
TRANSISTOR SWEEP CIRCUIT
Filed Feb. 24, 1958
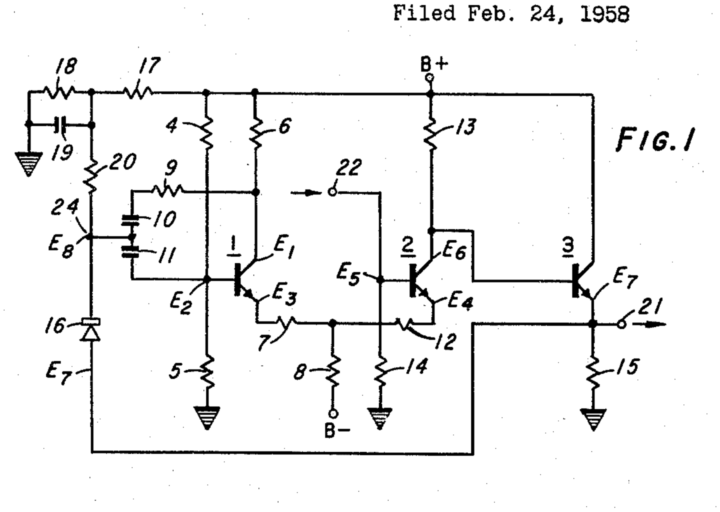
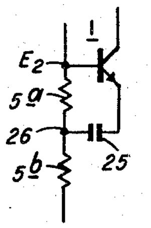
FIG. 3
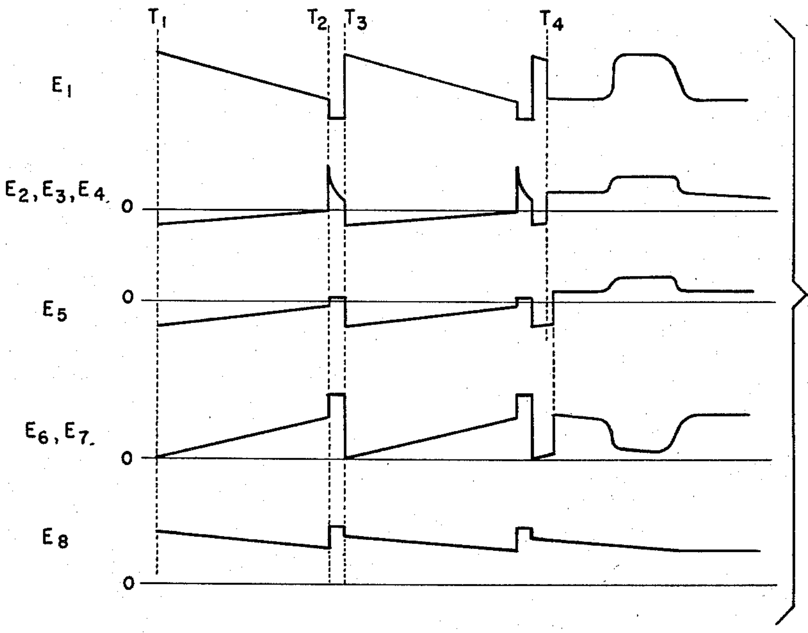
FIG. 2
INVENTOR.
R. J. SMITH
BY [signature]
ATTORNEY 2,936,427

TRANSISTOR SWEEP CIRCUIT

Remy J. Smith, North Hollywood, Calif., assignor to Bendix Aviation Corporation, North Hollywood, Calif., a corporation of Delaware Application February 24, 1958, Serial No. 717,062

8 Claims. (Cl. 331—109)

This invention relates broadly to electrical sweep circuits and, in particular, to transistorized self-oscillatory electrical sweep voltage generators.

An object of the invention is to provide a transistorized apparatus which will provide a cyclic voltage changing linearly with time over a desired voltage range during a portion of each cycle.

A further object is to provide such an apparatus that is responsive to an input control signal to function as a direct current amplifier having an output voltage corresponding to the input control voltage.

Another object is to improve the stability of a transistor amplifier without reducing its gain.

Further more specific objects and features of the invention will appear from the description to follow.

Briefly, a circuit in accordance with the invention may comprise three transistors and a diode arranged in a suitable circuit configuration. The first transistor operates as an amplifier with capacitive negative feedback obtained through a resistance-capacity network. The second transistor amplifies the output from the first transistor, and the third transistor operates as an emitter-follower to lower the source impedance of the output voltage. The third transistor is not essential to the general functioning of the apparatus to generate a saw-tooth voltage, although it increases the amplitude and improves the linearity of the output voltage. The diode serves as a switch to direct part of the output voltage back to the first amplifier and produce the cyclic generation of the saw-tooth sweep voltage.

A full understanding of the invention may be had from the following detailed description with reference to the drawing, in which:

Fig. 1 is a schematic diagram of a circuit incorporating the invention.

Fig. 2 is a series of graphs of voltage waves at different points in the circuit.

Fig. 3 shows a modification of the circuit of Fig. 1 for improving the linearity of the ramp portion of the output voltage.

Referring to Fig. 1, three transistors 1, 2 and 3, respectively, are arranged in tandem and connected in such a way as to normally oscillate and produce a saw-tooth voltage on an output terminal 21 while being responsive to an input voltage on an input terminal 22 to cease oscillating and amplify the input potential and deliver it to the output terminal 21.

Transistor 1 has its collector connected through a coupling resistor 6 to B+, its emitter connected through a coupling resistor 8 to B—, and its base connected to a biasing circuit consisting of voltage-dividing resistors 4 and 5 connected between B+ and ground. The circuit normally conditions the transistor for operation as a direct current amplifier, but such action is modified by a negative feedback circuit consisting of a resistor 9 and capacitors 10 and 11 connected in series between the collector and base.

Transistor 2 has its emitter connected through small stabilizing resistors 12 and 7 to the emitter of transistor 1; its base connected to the input terminal 22, and to ground through a resistor 14; and its collector to B+ through a coupling resistor 13 and to the base of transistor 3, which is connected as an emitter-follower with its collector connected directly to B+ and its emitter connected to the output terminal 21 and to ground through a coupling resistor 15.

To provide a positive feedback path from the output of the transistor 3 to the input (base) of transistor 1 under certain conditions, the output terminal 21 is connected through a diode 16 to a terminal 24 which is connected to the junction of capacitors 10 and 11. The terminal 24 is biased to a desired positive potential through a resistor 20 from a voltage divider consisting of resistors 17 and 18 connected between B+ and ground, a capacitor 19 being shunted across resistor 18 to stabilize the potential.

The potentials at various points in Fig. 1 are identified as $E_1$—$E_8$ and shown by the waveforms in Fig. 2. When no control potential is applied to the input terminal 22, the circuit oscillates, and the potentials change cyclically as shown in Fig. 2. The operation will now be described with reference to Figs. 1 and 2.

At time $T_1$, the base potential $E_2$ of transistor 1 has been driven to maximum negative value (by action to be described later) and rises toward normal value as current flows from B+ through resistor 4 into capacitor 11. As the base potential $E_2$ rises, the transistor 1 becomes more conductive, and the collector potential $E_1$ falls. The dropping potential $E_1$ is fed back through the resistor 9 and the capacitors 10 and 11 to the base, opposing the rise of potential $E_2$ by negative feedback action and causing potential $E_2$ to rise more slowly and linearly than it otherwise would. At this time, the output potential $E_7$ is less positive than $E_8$, so that the diode 16 is nonconductive.

As the potential $E_2$ rises, potential $E_3$ follows it. Potential $E_6$ rises more rapidly because of the amplification of transistor 2, and potential $E_7$ follows potential $E_6$.

The generation of the linear ramp wave continues until time $T_2$, when the rising output potential $E_7$ exceeds the dropping potential $E_8$ at terminal 24, causing diode 16 to conduct and thereby complete the positive feedback path from the emitter of transistor 3 through the diode 16 and the capacitor 11 to the base of transistor 1. This positive feedback action starts the following sequence of operations:

(1) Potential $E_2$ rises, and potential $E_1$ drops substantially vertically until the collector of the transistor 1 saturates, halting further rise of potentials $E_7$ and $E_8$;

(2) With the rise of potential $E_8$ halted, potential $E_2$ drops exponentially as capacitor 11 charges through resistor 5 to ground, and through the base and emitter of transducer 1, resistors 7 and 8, to B—, chiefly the latter;

(3) When potential $E_2$ has dropped below the saturation level of transistor 1 (time $T_3$), the latter again becomes effective as an amplifier, restoring the positive feedback loop circuit so that the potentials $E_2$ to $E_8$ drop substantially vertically until potential $E_7$ drops below potential $E_8$ to render diode 16 nonconductive (thereby opening the feedback loop circuit), whereupon a cycle is completed and the generation of a new ramp wave begins.

It is to be noted that from time $T_2$ to time $T_3$, although potential $E_8$ is constant, current continues to flow through diode 16 into capacitor 11 as the latter charges through resistors 5 and 8. At time $T_3$, charging current continues to flow through diode 16 (maintaining the closed feedback loop circuit) into capacitor 11, even though potentials $E_7$ and $E_8$ are dropping, until potentials $E_7$ and $E_8$ reach the potential at which capacitor 11 ceases to charge and seeks to discharge, whereupon current flow through the diode 16 ceases and the feedback loop is interrupted.

The length of the ramp wave and the frequency of repetition of the ramp cycle can be varied by changing the value of the resistor 4. This changes the steady state value of potential $E_2$, which is the voltage limit to which the capacitors 10 and 11 can discharge through resistor 9, without changing the resistance in the capacitor discharge circuit. The slope of the ramp wave can be varied by varying resistor 9 and capacitors 10 and 11.

The circuit continues to cycle unless a positive control potential is applied to the input terminal 22. Such a potential is applied at time $T_4$, whereupon the output potential $E_7$ moves in accordance with the control potential ($E_5$) within the amplitude limits of the ramp portion of potential $E_7$. The positive control potential on the base of the transistor 2 prevents the potential $E_7$ from reaching the level at which the diode 16 conducts and completes the positive feedback circuit.

The linearity of the sweep potential $E_7$ (times $T_1$ to $T_2$ in Fig. 2) may be improved by changing the base circuit of the transistor 1 to that of Fig. 3. Referring to Fig. 3, the resistor 5 of Fig. 1 is split into two resistors *5a* and *5b* that can be about equal and whose sum is equal to the resistor 5. A capacitor 25 is inserted between the emitter and the junction 26 of the two resistors *5a* and *5b*. When a rise in the potential $E_2$ at the base of transistor 1 causes the base current to increase, the current through the emitter resistors 7 and 8 increases, and the voltage at the emitter rises. The rise in voltage on the emitter is fed back through capacitor 25 to the junction 26 so the potential thereof changes with potential $E_2$. Therefore, the change in current through the resistor *5a* in response to a change in the potential $E_2$ is very small. This effectively multiplies the resistance of resistor *5a* to changing values of potential $E_2$. The linearity of the sweep is improved, because very little of the potential due to negative feedback from the collector through resistor 9 and capacitors 10 and 11 is dissipated in resistors *5a* and *5b*, and most of it is applied to the base of transistor 1.

A typical circuit in accordance with Fig. 1 may have the following values:

| | |
|---|---|
| B+ | 60 volts. |
| B− | 15 volts. |
| Resistor 4 | 500,000 ohms. |
| Resistor 5 | 10,000 ohms. |
| Resistor 6 | 27,000 ohms. |
| Resistor 7 | 100 ohms. |
| Resistor 8 | 7,000 ohms. |
| Resistor 9 | 100,000 ohms. |
| Resistor 12 | 100 ohms. |
| Resistor 13 | 27,000 ohms. |
| Resistor 14 | 10,000 ohms. |
| Resistor 15 | 27,000 ohms. |
| Resistor 17 | 15,000 ohms. |
| Resistor 18 | 39,000 ohms. |
| Resistor 20 | 15,000 ohms. |
| Capacitor 10 | .22 mfd. |
| Capacitor 11 | .47 mfd. |
| Capacitor 19 | 10 mfd. |
| Capacitor 25 | 40 mfd. |
| Diode 16 | IN 459 silicon diode. |
| Transistors 1, 2 and 3 | NPN junction transistors. |
| Potential range of sweep | 42 volts. |
| Duration of sweep | 0.1 sec. |
| Departure from linearity of sweep wave | Approximately 10%. |

Summarizing, the present invention comprises an amplifying means consisting of a plurality of amplifying devices constituted by the transistors 1, 2 and 3, and having an input terminal constituted by the base of transistor 1, and having the output terminal 21. Resistive circuit means, consisting of the B+ source and the resistors 4 and 5 connected in series as a voltage-dividing device, impresses a normal potential on the input terminal that is near the upper limit of the normal input potential, but less than the input potential at which the transistor 1 saturates. The diode 16 and the capacitor 11, connected in the order named between the output terminal 21 and the input terminal constituted by the base of transistor 1, define a positive feedback path for changing potentials when the diode 16 is conducting. The B+ source and the voltage-dividing network consisting of the resistors 17 and 18 and the capacitor 19, together with the resistor 20, constitute a means for applying to the junction of the capacitor 11 and diode 16 at terminal 24 a reference potential of magnitude intermediate the minimum and maximum potentials of the output terminal 21, and the diode 16 is so poled as to conduct and thereby complete the feedback path from the output terminal 21 to the base of transistor 1 only when the output potential exceeds the reference potential. At the beginning of the ramp portion of each cycle, the input potential $E_2$ has been driven to a low value and thereafter rises as the capacitor 11 charges through the resistor 4. The output potential $E_7$ on the output terminal 21 rises with, but faster than, the input potential $E_2$ until it exceeds the value of the reference potential $E_8$, thereby rendering the diode 16 conductive and completing the feedback path through capacitor 11 to the base of transistor 1. While this feedback path is completed, any change in the input potential $E_2$ is caused to proceed almost instantly, by virtue of the feedback, to the limit to which it can go. Initially, $E_2$ is rising, and it continues to rise until the transistor 1 saturates and can no longer amplify, thereby destroying the loop-amplifying circuit and halting further rise in the output potential $E_7$. The input potential $E_2$ then falls slowly as capacitor 11 discharges, until it drops below the saturating value of transistor 1, and the latter again becomes effective as an amplifier. Since the positive feedback circuit through the diode 16 is still effective, the potentials $E_2$ and $E_7$ then drop very rapidly until reversal of current through the diode 16 renders it nonconductive and opens the feedback path. At this time, the input potential $E_2$ has been driven to its initial low value, and when the diode 16 becomes nonconductive, a new cycle is started.

The provision of the negative feedback circuit constituted by the resistor 9 and capacitor 10 connected between the collector of transistor 1 and (through capacitor 11) to the base improves the linearity of the ramp wave. This linearity is further improved by the modification shown in Fig. 3, in which the resistor 5 of Fig. 1 is divided into two sections 5A and 5B, and the capacitor 25 is connected between the junction of the two sections and the emitter.

The circuit of transistor 1, as modified in Fig. 3, has general utility in improving the performance of transistor emitter amplifiers. It permits the use of a ground return path (resistors *5a* and *5b*) of relatively low D.C. resistance, for stability, while having high effective A.C. resistance by reason of the positive feedback of A.C. energy through the capacitor 25.

The coupling of the emitter of transistor 1 to the emitter of transistor 2 and the grounding of the base of transistor 2 through the resistor 14 permit conversion of the circuit from operation as a ramp wave oscillator to a direct-current amplifier in response to the application of a control potential to the base of the transistor 2 from the input terminal 22.

Although for the purpose of explaining the invention a particular embodiment thereof has been shown and described, obvious modifications will occur to a person skilled in the art, and I do not desire to be limited to the exact details shown and described.

I claim:

1. A saw-tooth wave oscillator comprising: direct-current amplifying means having input and output terminals and saturable at a saturating input potential; resistive circuit means for normally impressing a potential on said input terminal near to but less than said saturating potential; means including a diode and a capacitor connected in the order named between said output terminal and said input terminal constituting a positive feedback path for changing potentials when said diode is conducting; means for applying to the junction of said capacitor and said diode a reference potential of magnitude intermediate the minimum and maximum potentials at said output terminal, said diode being poled to conduct and thereby complete said feedback path only when said output potential exceeds said reference potential.

2. Apparatus for alternately functioning as a saw-tooth oscillator or an amplifier compising: direct current amplifying means saturable at a saturating input potential and including a plurality of amplifying devices connected in cascade, each having input and output terminals, and means for conductively connecting an output terminal of each device except the last to an input terminal of the next device; resistive circuit means for normally impressing a potential on the input terminal of the first of said devices near to but less than said saturating potential; means including a diode and a capacitor connected in the order named between the output terminal of the last of said devices and said input terminal of said first device constituting a positive feedback path for changing potentials when said diode is conducting; means for applying to the junction of said capacitor and said diode a reference potential of magnitude intermediate the minimum and maximum potentials at said output terminal of said last device, said diode being poled to conduct and thereby complete said feedback path only when said output potential exceeds said reference potential; and means for applying a direct control potential to be amplified to an input terminal of an intermediate one of said devices.

3. Apparatus in accordance with claim 2 in which said devices are transistors, each having a base, collector, and emitter, the base of the first transistor constituting said input terminal of said amplifier and the second transistor constituting said intermediate device; means coupling the emitter of the first transistor to the emitter of the second transistor, the base of said second transistor constituting said input terminal to which said direct control potential to be amplified is applied; and means coupling the collector of said second transistor to the base of the next transistor.

4. Apparatus in accordance with claim 1 in which said amplifying means comprises a plurality of amplifying devices connected in cascade, the first device having input, output and common terminals, the input terminal constituting said amplifier input terminal; an energizing current source and separate coupling resistors connecting said source between said output and common terminals, respectively; means including one of said coupling resistors coupling said common terminal to the next succeeding amplifying device; means including said first-mentioned capacitor and a second capacitor connected in series between said input and output terminals of said first amplifying device, and constituting a negative feedback path for varying potentials from the output to the input of said first amplifying device.

5. Apparatus in accordance with claim 4 in which said negative feedback path includes a resistor.

6. Apparatus in accordance with claim 4 in which said resistive circuit means for normally impressing a predetermined potential on said input terminal comprises a current source and a voltage divider connected thereacross, said voltage divider comprising a first resistance means connecting one terminal of said source to said input terminal, and second resistance means connecting the other terminal of said source to said input terminal.

7. Apparatus according to claim 6 in which said second resistance means comprises a pair of resistance elements connected in series; and a capacitor connecting said common terminal of said first amplifying device to the junction of said resistance elements.

8. A semiconductor amplifier comprising: a transistor having a base, a collector, and an emitter; an energizing current source having first and second terminals of different potentials and a third terminal of potential intermediate those of said first and second terminals; means connecting said first terminal of said source to said collector; means including a coupling resistor connecting said second terminal of said source to said emitter, the end of said coupling resistor adjacent said emitter constituting the signal output terminal of said amplifier; means for applying an input signal potential to be amplified to said base; means for biasing said base to conductive polarity with respect to said emitter including a pair of biasing resistors connected in series with each other between said base and said third terminal of said source; and means for providing positive feedback to compensate for signal losses in said biasing resistors comprising a capacitor connecting said emitter to the junction of said biasing resistors.

References Cited in the file of this patent

UNITED STATES PATENTS

| | | |
|---|---|---|
| 2,762,875 | Fischer | Sept. 11, 1956 |
| 2,768,294 | Overbeek | Oct. 23, 1956 |
| 2,787,712 | Priebe | Apr. 2, 1957 |
| 2,810,080 | Trousdale | Oct. 15, 1957 |
| 2,835,750 | Volkers et al. | May 20, 1958 |